United States Patent
Aoki et al.

(10) Patent No.: US 7,442,652 B2
(45) Date of Patent: Oct. 28, 2008

(54) METHOD FOR REMOVING CONTAMINATION AND METHOD FOR FABRICATING SEMICONDUCTOR DEVICE

(75) Inventors: Hidemitsu Aoki, Kanagawa (JP); Kaori Watanabe, Kanagawa (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/357,087

(22) Filed: Feb. 3, 2003

(65) Prior Publication Data

US 2003/0148627 A1    Aug. 7, 2003

(30) Foreign Application Priority Data

Feb. 4, 2002   (JP)   ............................. 2002-027361

(51) Int. Cl.
*H01L 21/311*   (2006.01)

(52) U.S. Cl. ...................... 438/750; 438/745; 438/751; 216/2

(58) Field of Classification Search ................ 438/471, 438/477, 704, 745, 747, 749–751, 754, 906, 438/689; 216/2, 6, 13, 16, 96, 99–101
See application file for complete search history.

(56) References Cited

U.S. PATENT DOCUMENTS

| | | | | |
|---|---|---|---|---|
| 4,738,747 A | * | 4/1988 | Panson | 216/93 |
| 4,871,417 A | * | 10/1989 | Nishizawa et al. | 438/748 |
| 5,075,256 A | * | 12/1991 | Wang et al. | 438/716 |
| 5,254,202 A | * | 10/1993 | Kaplan | 156/345.1 |
| 5,258,093 A | * | 11/1993 | Maniar | 438/3 |
| 5,695,569 A | * | 12/1997 | Douglas | 134/1.3 |
| 6,022,400 A | * | 2/2000 | Izumi et al. | 106/3 |
| 6,245,158 B1 | * | 6/2001 | Verhaverbeke | 134/10 |
| 6,254,796 B1 | * | 7/2001 | Rath et al. | 216/87 |
| 6,284,721 B1 | | 9/2001 | Lee | |
| 6,300,202 B1 | * | 10/2001 | Hobbs et al. | 438/287 |
| 6,346,505 B1 | * | 2/2002 | Morita et al. | 510/175 |
| 6,402,851 B1 | * | 6/2002 | Piltingsrud | 134/1 |
| 6,413,386 B1 | * | 7/2002 | Callegari et al. | 204/192.23 |

(Continued)

FOREIGN PATENT DOCUMENTS

JP    5-21595    1/1993

(Continued)

OTHER PUBLICATIONS

Mitsuo et al. "Wet chemical cleaning for damaged layer removal inside the deep sub-micron contact hole", Aug. 1998, IEEE, pp. 327-331.*

(Continued)

*Primary Examiner*—Douglas M. Menz
*Assistant Examiner*—Matthew W Such
(74) *Attorney, Agent, or Firm*—Muirhead and Saturnelli, LLC

(57) ABSTRACT

A method for removing contamination on a semiconductor substrate is disclosed. The contamination contains at least one element belonging to one of 3A group, 3B group and 4A group of long-period form of periodic system of elements. The method comprises first and second process steps. The first process is wet processing the semiconductor substrate by first remover liquid that contains one of acid and alkali. The second process is wet processing the semiconductor substrate by second remover liquid that contains oxidizing reagent and one of hydrofluoric acid and salt of hydrofluoric acid.

16 Claims, 9 Drawing Sheets

U.S. PATENT DOCUMENTS

| | | | |
|---|---|---|---|
| 6,423,146 B1 * | 7/2002 | Fukazawa | 134/2 |
| 6,444,010 B1 | 9/2002 | Watanabe | |
| 6,465,853 B1 * | 10/2002 | Hobbs et al. | 257/410 |
| 6,468,357 B1 | 10/2002 | Aoki et al. | |
| 6,514,808 B1 * | 2/2003 | Samavedam et al. | 438/197 |
| 6,555,879 B1 | 4/2003 | Krivokapic et al. | |
| 6,562,726 B1 * | 5/2003 | Torek et al. | 438/745 |
| 6,568,995 B1 * | 5/2003 | Mitani et al. | 451/36 |
| 6,723,658 B2 * | 4/2004 | Eissa et al. | 438/745 |
| 6,727,187 B2 * | 4/2004 | Takeshima et al. | 438/745 |
| 6,835,667 B2 * | 12/2004 | Christenson et al. | 438/745 |
| 2001/0023701 A1 | 9/2001 | Aoki et al. | |
| 2001/0024852 A1 | 9/2001 | Aoki et al. | |
| 2002/0016068 A1 * | 2/2002 | Nakano et al. | 438/689 |
| 2002/0064970 A1 * | 5/2002 | Chooi et al. | 438/785 |
| 2003/0104706 A1 * | 6/2003 | Mitsuhashi et al. | 438/756 |
| 2003/0109106 A1 * | 6/2003 | Pacheco Rotondaro et al. | 438/287 |
| 2003/0235985 A1 * | 12/2003 | Christenson et al. | 438/689 |
| 2004/0102009 A1 * | 5/2004 | Quevedo-Lopez et al. | 438/287 |

FOREIGN PATENT DOCUMENTS

| | | |
|---|---|---|
| JP | 7-268657 | 10/1995 |
| JP | 9-312275 | 12/1997 |
| JP | 10-307087 | 11/1998 |
| JP | 11-168076 | 6/1999 |
| JP | 2000-31104 | 1/2000 |
| JP | 2000-47237 | 2/2000 |
| JP | 2001-68463 | 3/2001 |
| JP | 2002-25967 | 1/2002 |

OTHER PUBLICATIONS

Chambers et al. Effect of composition and post-deposition annealing on the etch rate of Hafnium and Zirconium silicates in dilute HF; Electrochemical Society, Procesings vol. 2001-26, pp. 359-365 (2001).*

Quevedo-Lopez, M.A., et al. "Wet Chemical Etching Studies of Zr and Hf-Silicate Gate Dielectrics." J. Vac. Sci. Technol. A. vol. 20 (2002): 1891-1897.*

Quevedo-Lopez, M.A., et al. "Wet Chemical Etching Studies of Zr and Hf-Silicate Gate Dielectrics." J. Vac. Sci. Technol. A. vol. 20 (2002): 1891-1897.*

Quevedo-Lopez, M., et al. "Thermally Induced Zr Incorporation Into Si From Zirconium Silicate Thin Films." Appl. Phys. Lett. vol. 79 (2001): pp. 2958-2960.*

* cited by examiner

FIG.2
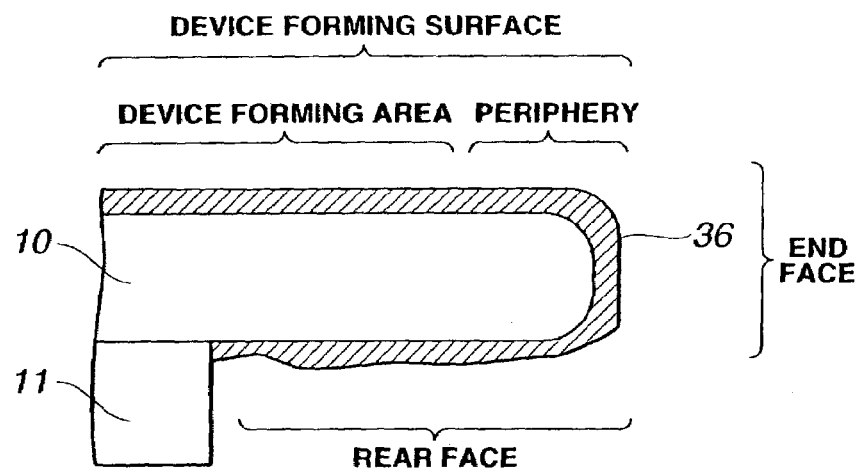
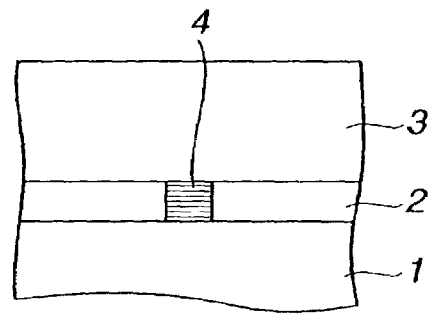
FIG.3A
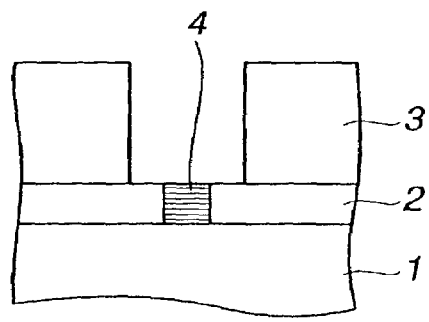
FIG.3B
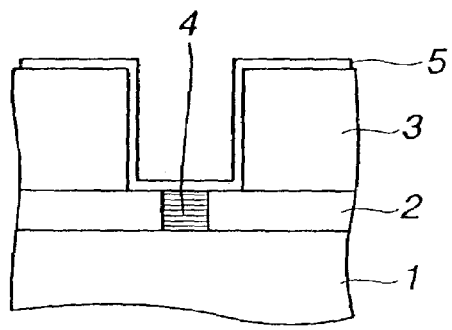
FIG.3C

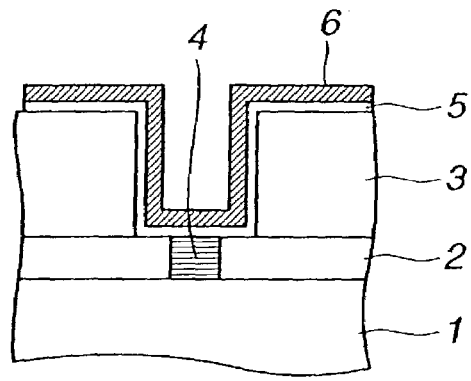
FIG.4A
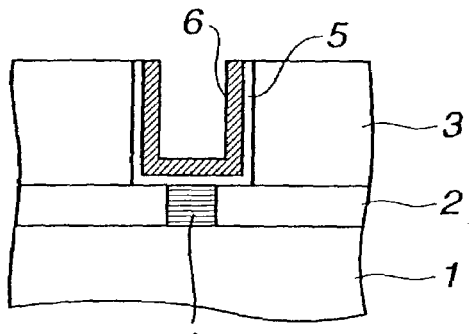
FIG.4B
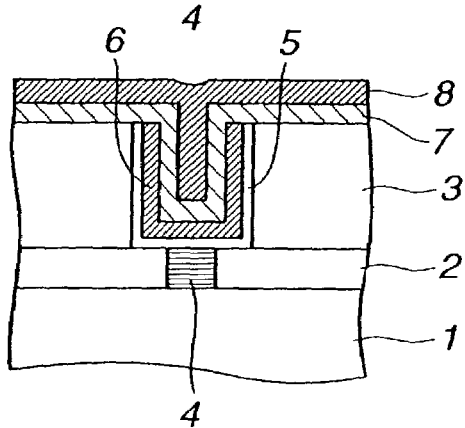
FIG.4C
FIG.5
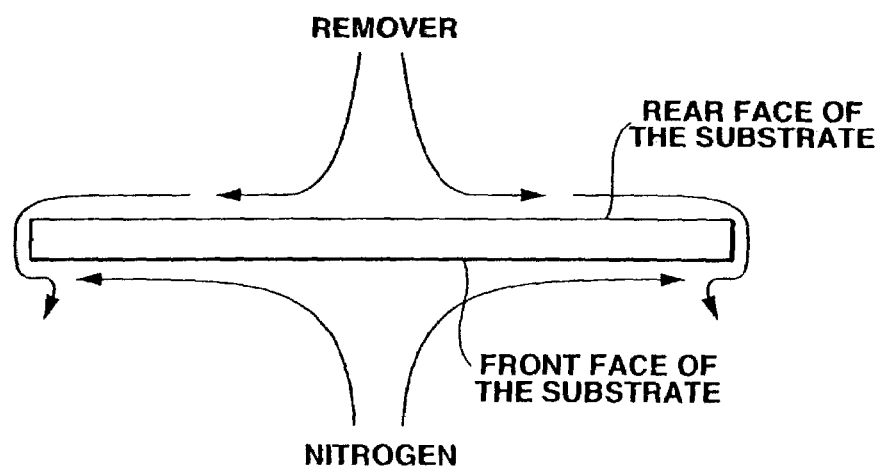

METHOD FOR REMOVING CONTAMINATION AND METHOD FOR FABRICATING SEMICONDUCTOR DEVICE

BACKGROUND OF THE INVENTION

1. Field of the Invention

The present invention relates in general to a method for fabricating semiconductor devices. More particularly, the present invention relates to a method for removing contamination that contains at least one element belonging to one of 3A group, 3B group and 4B group of long-period form of periodic system of elements.

2. Description of the Related Art

The miniaturization and large-scale integration required in development of MOSFETs have accelerated extensive study and effort on reducing thickness of gate insulators. The reduction of gate insulators to several nanometers thick has been accomplished at the present level of technology. However, further reduction in thickness provides poor device performance due to its gate leakage current.

To go beyond this thickness barrier, the high-k films like refractory metal oxides $ZrO_x$, $HfO_x$ and $AlO_x$ are expected to play an important role as gate insulator materials although silicon dioxide has thus far proved to be the perfect gate insulator.

Tantalum oxide $TaO_x$ is now under study as capacitor material of DRAMs thanks to its high dielectric property. However, the occurrence of leakage current poses problem to be solved. Again, the high-k films like zirconium oxide $ZrO_x$ and hafnium oxide $HfO_x$ are expected to play an important role as capacitor materials.

However, the oxides of 3A-group, 3B-group and 4A-group elements are difficult to remove. If the contamination of such material as above is adhered to the surface of a silicon substrate or to a film of silicon oxide, it is very difficult to remove because the element(s) belonging to 3A-group, 3B-group and 4A-group react with silicon material to form silicides or silicates.

Hydrofluoric acid is known as a strong remover liquid for the contamination on the surface of silicon substrate. Hydrofluoric acid can remove the contamination due to lift off process involving dissolution of a portion of the silicon substrate. The technique of this kind is disclosed in JP-A 5-21595 and JP-A 10-307087.

However, hydrofluoric acid alone has proved to be insufficient for removing contamination of high-k film. The films of different materials were etched with an aqueous solution of hydrofluoric acid by 50 mass %. The results are Thermal silicon oxide film: 1000 nm/minute;

$ZrO_2$ film: 2 nm/minute;

$HfO_2$ film: 0.5 nm/minute.

The above list clearly indicates that the high-k material is difficult to remove due to it low etch rate.

The present invention aims at providing a technique to remove sufficiently metal(s) formed on a semiconductor substrate, the metal(s) belonging to one of 3A group, 3B group and and 4B group of long-period form of periodic system of elements.

SUMMARY OF THE INVENTION

An object of the present invention is to provide a method for removing, at a sufficiently high cleaning level, contamination on a semiconductor substrate, the contamination containing at least one element belonging to one of 3A group, 3B group and 4B group of long-period form of periodic system of elements.

According to one exemplary implementation of the invention, there is provided a method for removing contamination on a semiconductor substrate, the contamination containing at least one element belonging to one of 3A group, 3B group and 4B group of long-period form of periodic system of elements, the method comprising:

a first process of wet processing the semiconductor substrate by first remover liquid that contains at least one of acid and alkali; and a second process of wet processing the semiconductor substrate by second remover liquid that contains oxidizing reagent and one of hydrofluoric acid and salt of hydrofluoric acid.

BRIEF DESCRIPTION OF THE DRAWINGS

The present invention will be apparent from the following more particular description of exemplary embodiments of the invention as illustrated in the accompanying drawings. The drawings are not necessarily scale, emphasis instead being placed upon illustrating the principles of the invention.

FIG. 2 is a schematic view, illustrating portion of a semiconductor substrate with contamination.

FIGS. 3A to 3C are views illustrating fabrication process steps of a capacitor.

FIGS. 4A to 4C are views illustrating the subsequent fabrication process steps of the capacitor.

FIG. 5 is a view illustrating one example a spin washing process.

DESCRIPTION OF THE EXEMPLARY EMBODIMENTS

Figure 1A:
FIGS. 1A to 1D are views illustrating fabrication process steps of a gate electrode implementing the present invention.

Referring to the accompanying drawings, the same reference numerals are used to designate same or similar parts or portions throughout each view of Figures for the sake of brevity of description.

Throughout the specification, the term "remover liquid" is herein used to mean liquid for removing contamination attached to a surface portion of a semiconductor substrate other than a device forming surface thereof, and liquid for etching film or films for patterning in forming semiconductor device. The above-mentioned surface portion includes a rear face and an end face.

The present invention is applicable to a method for fabricating a gate electrode and also to a method for fabricating a capacitor.

A so-called "spin washing process" may be advantageously used in practicing the present invention. In the process of washing, remover liquid should be prevented from flowing to the device forming surface. Two examples of the spin washing process are described below.

According to the spin washing process in FIG. 5, remover liquid is sprayed to a rear surface or face of a spinning substrate. Inert gas, such as nitrogen gas, is admitted to cover a front (or a device forming) surface or face of the substrate to prevent remover liquid from going around to come into contact with the device forming surface. According to the spin washing process in FIGS. 6A and 6B, a rear-face nozzle 22 and an end-face nozzle 23 are positioned around a spinning semiconductor substrate 10 for spray injection of remover liquid. A front-face nozzle 21 is so positioned as to inject liquid, such as pure water, onto a device forming surface of the substrate to prevent the remover liquid from contacting with the device forming surface. The liquid is chosen such that it will not harm or damage the device forming surface.

Using the spin washing process has proven to be effective in preventing damage of the device forming surface by remover liquid.

In embodiments of the present invention, a so-called high-k film is selected as a film or contamination that contains at least one element belonging to one of 3A group, 3B group and 4B group of long-period form of periodic system of elements. The material of the high-k film includes at least one of zirconium, zirconium oxide, hafnium, hafnium oxide, lanthanoids, and lanthanoid oxides. Aluminum, aluminum oxide, indium, indium oxide, gallium, and gallium oxide are other examples of component, which may be used or contained in the material of the high-k film. Examples of component are Zr, Hf, Pr, La, Lu, Eu, Yb, Sm, Ho, Ce, Al, In, Ga, and their oxides.

Concretely saying, these oxides include $ZrO_x$, $HfO_x$, $Al_2O_3$, $In_2O_3$, and $Ga_2O_3$. Among them, $ZrO_x$ and $HfO_x$ are preferred in their characteristics and in their properties best fit to semiconductor fabrication process.

In the embodiments of the present invention, oxidizing reagent is used. The oxidizing reagent is at least one compound selected from a group consisting of nitric acid, chloric acid, perchloric acid, iodic acid, periodic acid, bromic acid, perbromic acid, salt containing bromine oxide ion, salt containing manganese oxide ion, and salt containing tetra cerium ion.

In the embodiments of the present invention, remover liquid preferably uses, as solvent, water or hydrophilic solvent. Examples of water soluble organic solvent that may be used are organic solvents, such as alcohol group, that are soluble with water and other element or elements of the remover liquid.

The remover liquid used in the embodiments of the present invention may contain surface active agent.

Figure 7:
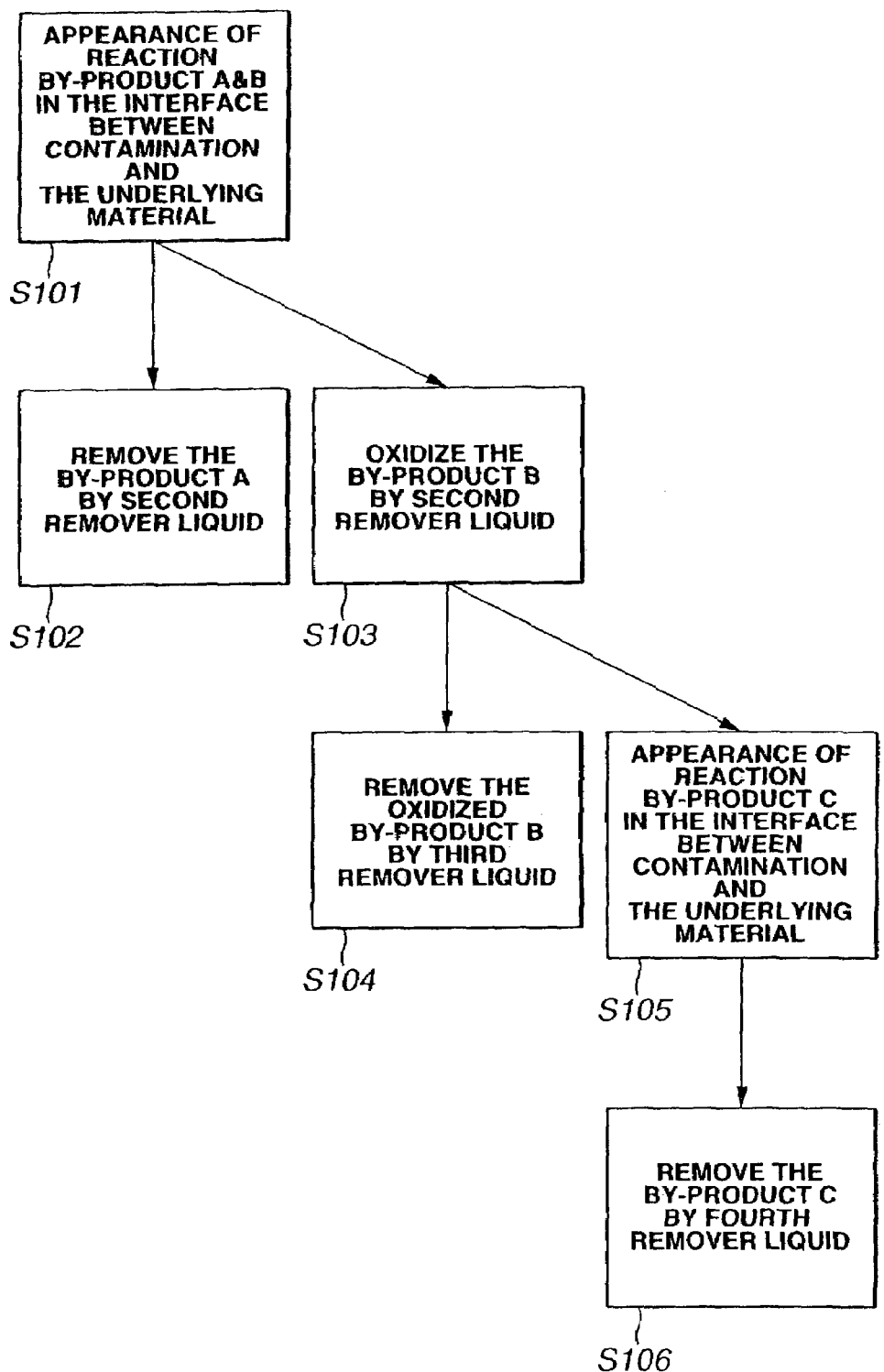
FIG. 7 is a contamination removing protocol according to one exemplary implementation of the present invention.

The contamination removing protocol in FIG. 7 may help understanding one exemplary implementation of the present invention. Although not illustrated in FIG. 7, the implementation of the present invention begins with forming a film on the underlying material. The material of the film contains at least one element belonging to one of 3A group, 3B group and 4B group of long-period form of periodic system of elements. Throughout the specification, the underlying material is herein used to mean the material of a semiconductor substrate and/or the material of a film formed on the semiconductor substrate. Examples of technique for forming the film forming on the underlying material are atomic layer chemical vapor deposition (AL-CVD) method, metal organic chemical vapor deposition (MOCVD) method, and sputtering method. In the process, there is appearance of reaction by-products, namely, A and B, in the interface between contamination (film) and the underlying material (step S101). Using a first remover liquid, although not shown, the film on the rear face of the semiconductor substrate is removed by wet processing the semiconductor substrate.

Using a second remover liquid, the semiconductor substrate is wet processed to remove the by-product A (step S102) and to oxidize the by-product B (step S103) that was not removed. The second remover liquid contains oxidizing reagent and one of hydrofluoric acid and salt of hydrofluoric acid. Due to combination effect of them, oxidation proceeds deeply inside of the by-product B.

Using a third remover liquid, the semiconductor substrate is wet processed to remove the oxidized by-product B (step S104). As it is, the by-product B is difficult to remove. However, the by-product B as deformed due to oxidation becomes easy to remove by application of hydrofluoric acid or salt of hydrofluoric acid.

In the process of three consecutive wet processing by first, second and third remover liquid, there is appearance of a reaction by-product C in the interface between the contamination (film) and the underlying material (step S105). Using a fourth remover liquid, the semiconductor substrate is wet processed to remove the by-product C.

In the above-mentioned manner, all of the by-products appearing in the interface between the contamination (film) and the semiconductor substrate (underlying material) can be removed according to the exemplary implementation of the present invention.

The first to fourth remover liquids are:

An example of the first remover liquid is, ($a_1$) An aqueous (a water) solution of hydrofluoric acid:

Three examples of the second remover liquid are, ($b_1$) An aqueous solution of oxidizing reagent, in the form of nitric acid, and an aqueous solution of hydrofluoric acid;

($b_2$) An aqueous solution of oxidizing reagent, in the form of nitric acid, and an aqueous solution of ammonium fluoride; and ($b_3$) An aqueous solution of oxidizing reagent, in the form of periodic acid, and an aqueous solution of hydrofluoric acid:

An example of the third remover liquid is, ($c_1$) An aqueous solution of hydrofluoric acid:

Three examples of the fourth remover liquid are, ($d_1$) An aqueous solution of oxidizing reagent, in the form of nitric acid, and an aqueous solution of hydrofluoric acid;

($d_2$) An aqueous solution of oxidizing reagent, in the form of nitric acid, and an aqueous solution of ammonium fluoride; and ($d_3$) An aqueous solution of oxidizing reagent, in the form of periodic acid, and an aqueous solution of hydrofluoric acid:

In the implementation of the present invention, the same remover liquid may be used as the first and third remover liquids. The same remover liquid may be used as the second and fourth remover liquids.

FIGS. 8A to 8E are views illustrating contamination removing process steps implementing the present invention. In the illustrated embodiment, we consider a film of zirconium oxide formed on a silicon substrate as contamination to be removed.

Figure 8A:
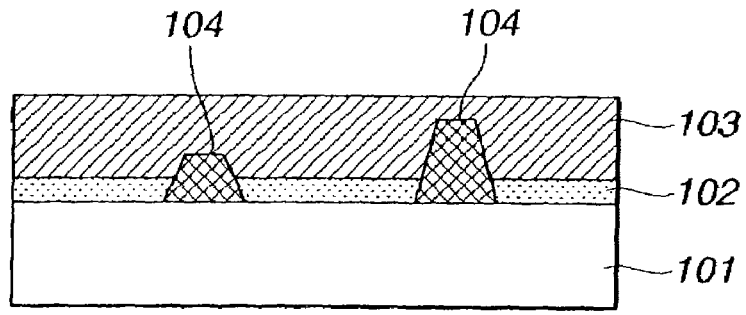
FIGS. 8A to 8E are views illustrating contamination removing process steps implementing the present invention.

In FIG. 8A, a film 103 of zirconium oxide ($ZrO_2$) is formed or deposited on the surface of a silicon substrate 101. Al-CVD may be used for the film deposition. Zirconium oxide ($ZrO_2$) reacts with silicon to create zirconium silicate 102 and zirconium silicide 104 in the interface. The composition of zirconium silicate 102 may be expressed as $(ZrSi)_x(SiO_2)_{1-x}$. The composition of zirconium silicide 104 may be expressed as $ZrSi_x$.

The illustrated state in FIG. 8A is wet processed by the first remover liquid that contains acid or alkali. In the illustrated embodiment, an aqueous solution of hydrofluoric acid is used as the first remover liquid. The concentration of hydrofluoric acid is equal to or greater than 30 mass %. Preferably, the concentration of hydrofluoric acid is equal to or greater than 40 mass %. This wet processing can remove the film 103 of $ZrO_2$. If desired, alkali may be used as the first remover liquid.

Figure 8B:
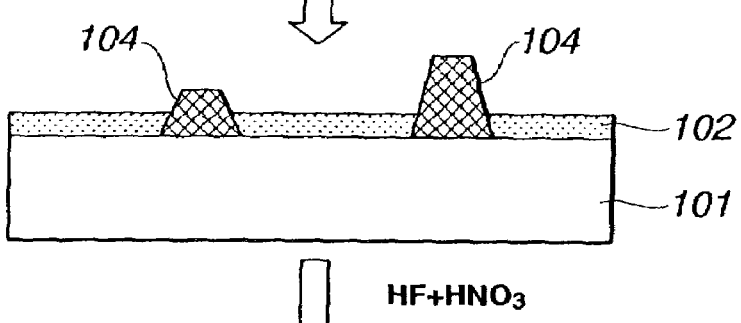

As shown in FIG. 8B, the zirconium silicate 102 and zirconium silicide 104 are left, as contamination, because the first remover liquid is not fit to removing them.

Figure 8C:
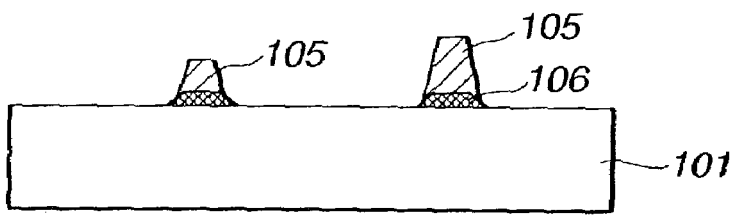

In order to remove this contamination 102 and 104, a second remover liquid is used for wet processing. The second remover liquid contains oxidizing reagent and one of hydrofluoric acid and salt of hydrofluoric acid. More particularly, in the embodiment, an aqueous solution of nitric acid by 20-70 mass % and hydrofluoric acid by 5-10 mass % is used as the second remover liquid. This second remover liquid is used to conduct wet processing. This results in removing the zirconium silicate 102, and oxidizing the zirconium silicide 104. As shown in FIG. 8C, the zirconium silicide 104 is oxidized to change in quality to make a portion 105 of $ZrO_2$ like material. In the interface between the portion 105 and the silicon substrate 101, zirconium silicate 106 appears.

Figure 8D:
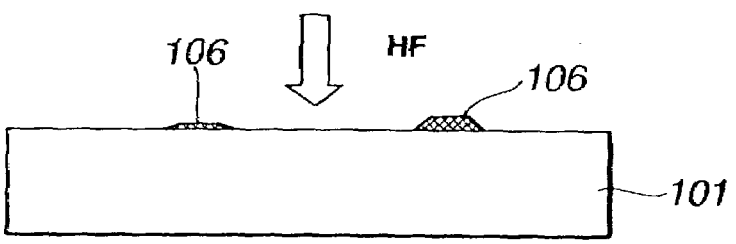

A third remover liquid is used for wet processing to remove the portion 105 of $ZrO_2$ like material. As the portion 105 is made of $ZrO_2$ like material, a remover liquid similar to the first remover liquid may be used as the third remover liquid. In the embodiment, an aqueous solution of hydrofluoric acid is used as the third remover liquid. The concentration of hydrofluoric acid is preferably equal to or greater than 30 mass %. More preferably, the concentration of hydrofluoric acid is equal to or greater than 40 mass %. With the wet processing using this third remover liquid, the portion 105 is removed as shown in FIG. 8D.

Figure 8E:

A fourth remover liquid is used for wet processing to remove the zirconium silicate 106. The fourth remover liquid contains oxidizing reagent and one of hydrofluoric acid and salt of hydrofluoric acid. More particularly, in the embodiment, an aqueous solution of nitric acid by 20-70 mass % and hydrofluoric acid by 5-10 mass % is used as the fourth remover liquid. With the wet processing using this fourth remover liquid, the zirconium silicate 106 is removed as shown in FIG. 8E.

Finally, rinsing with pure water completes the contamination removing process.

Referring to FIGS. 2, 3A-3C and 4A-4C, a DRAM capacitor fabrication process steps are explained.

Referring to FIGS. 3A-3C and 4A-4C, a capacitor is formed within a recess formed in a dielectric layer on a semiconductor substrate, by depositing, within the recess, a multi-layered structure of a lower electrode film, a capacitor dielectric film and an upper electrode film.

First, as shown in FIG. 3A, after forming on a silicon substrate 1 with a MOS transistor that includes a source drain diffusion region, not illustrated, an interlayer dielectric film 2 is formed over the whole surface area of the silicon substrate 1. Subsequently, a contact plug 4 is formed over an area where the source drain diffusion region is. The material of contact plug 4 is, for example, polysilicon or tungsten. After forming the contact plug 4, the surface of the substrate is flattened. Another interlayer dielectric film 3 is formed over the flattened surface.

In FIG. 3B, the dielectric film 3 is dry etched to form a hole reaching the contact plug 4. Preferably, the hole has an elliptic opening. The size of the elliptic opening may be appropriately determined. For example, the short diameter and long diameter of the elliptic opening are about 0.2 μm and about 0.4 μm, respectively.

As shown in FIG. 3C, an adherence film 5 is formed over the whole surface area of the substrate. The adherence film 5 is made of an under layer of Ti and an over layer of TiN. Sputtering or CVD is used to form the adherence film 5.

As shown in FIG. 4A, a lower electrode film 6 is formed over the whole surface area of the substrate. Examples of the material of the lower electrode film 6 are TiN, Ti, Ru, Pt, Ir, Ta, and TaN.

With continuing reference to FIG. 4A, photo resist is embedded to fill the recess. Subsequently, the unnecessary portions of the adherence film 5 and the lower electrode film 6 are removed by etch back and chemical mechanical polishing (CMP) techniques. FIG. 4B shows the state after washing. The adherence film 5 and lower electrode film 6 are made as high as the interlayer dielectric film 3 to prevent the lower electrode film 6 from contacting with the adjacent capacitor electrode.

As shown in FIG. 4C, a capacitor dielectric film 7 of $ZrO_2$ is formed over the whole surface area of the substrate, and then an upper electrode film 8 is formed.

The material of the capacitor dielectric film 7 contains an element or elements belonging to one of 3A group, 3B group and 4B group of long-period form of periodic system of elements. The material includes at least one of zirconium, zirconium oxide, hafnium, hafnium oxide, lanthanoids, and lanthanoid oxides. Examples of component of the material are Zr, Hf, Pr, La, Lu, Eu, Yb, Sm, Ho, Ce, and their oxides. Particularly, $ZrO_x$ and $HfO_x$ are preferred in their characteristics and in their properties best fit to semiconductor fabrication process. CVD, sputtering and sol-gel are technique, which may be used to form the capacitor dielectric film. Among them, CVD is preferable because the damage to the substrate is low and good covering of the fine pattern is ensured.

In the embodiment, AL-CVD technique is used to deposit $ZrO_2$ to form the capacitor dielectric film 7.

Examples of the material of the upper electrode film 8 are TiN, Ti, Ru, Pt, Ir, Ta, and TaN.

Subsequently, dry etch technique is used to divide the capacitor dielectric film 7 and upper electrode film 8 into separated component units.

In the above-mentioned fabrication process, contamination of material containing zirconium is left adhered to surface portions of the substrate other than device or component forming regions. In the embodiment, this contamination is removed by washing process.

Referring to FIG. 2, the zirconium containing material 36 is adhered, as contamination, to cover the rear face and end face of a semiconductor substrate 10 on a support 11. If the adhered zirconium material 36 is left adhered to during the subsequent semiconductor fabrication process, the film forming apparatus is contaminated. Another problem is that zirconium containing material 36 is diffused into the silicon substrate, causing bad influence to operation of components.

Here, a need remains for completely removing the zirconium containing material 36.

Figure 6A:
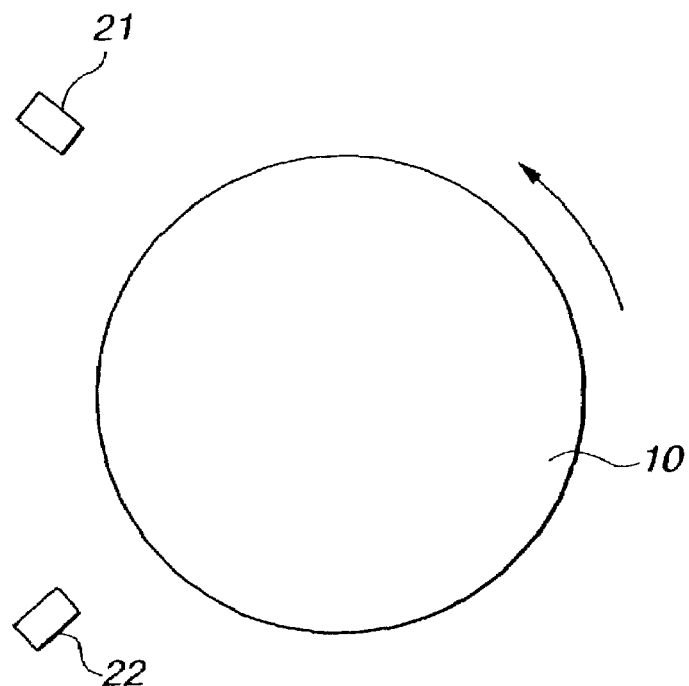
FIGS. 6A and 6B are views illustrating another example of a spin washing process.
Figure 6B:
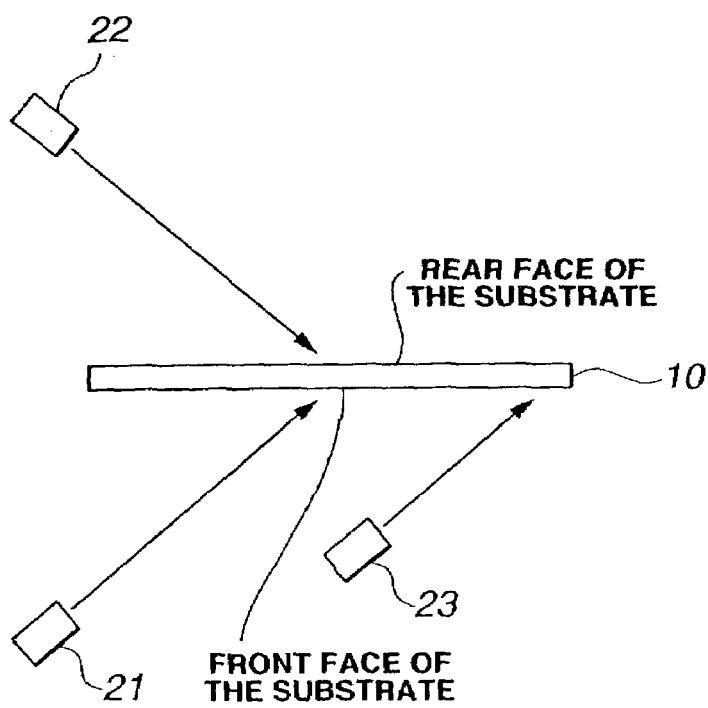

In washing process, washing process steps A to C mentioned below is carried out to wash the substrate rear and end faces. In the embodiment, the before-mentioned spin washing process as illustrated in FIGS. 5 and 6A-6B is employed.

The rate of removing zirconium is temperature dependent. A considerable reduction in washing time is achieved if the remover liquid is maintained at temperature equal to or higher than 40° C.

In the embodiment, the four removing or washing process steps A to D are employed.

In step A, an aqueous solution of hydrofluoric acid equal to or greater than 40 mass % is used as a first remover or washing liquid. The washing time is 10 to 150 seconds.

In step B, an aqueous solution containing nitric acid 10-80 mass % and hydrofluoric acid 1-20 mass % is used as a second remover or washing liquid. The washing time is 1 to 10 seconds.

In step C, an aqueous solution of hydrofluoric acid equal to or greater than 40 mass % is used as a third remover or washing liquid. The washing time is 10 to 60 seconds.

In step D, an aqueous solution containing nitric acid 10-80 mass % and hydrofluoric acid 1-20 mass % is used as a second remover or washing liquid. The washing time is 1 to 10 seconds.

As mentioned before in connection with FIG. 7, zirconium silicate and zirconium silicide created in the interface between the $ZrO_2$ and the silicon substrate are difficult to remove.

In the embodiment, these materials are removed by carrying out the washing process steps A to D mentioned above.

Carrying out the process step A removes $ZrO_2$ from the rear and end faces of the substrate. Subsequently, carrying out the process step B removes the zirconium silicate and oxidizes zirconium silicide. Due to the combination effect of nitric acid and hydrofluoric acid, oxidation proceeds deeply into the zirconium silicide. In this manner the zirconium silicide changes in quality into the $ZrO_x$ like film.

Carrying out the process step C removes the $ZrO_x$ like film. As it is, zirconium silicide is difficult to remove. However, the zirconium silicide as deformed into the $ZrO_x$ like film is easy to remove by application of aqueous solution of hydrofluoric acid equal to or greater than 40 mass %.

In the interface between the $ZrO_x$ and the silicon substrate, a reaction by-product of zirconium silicate appears. To remove this by-product, the process step D is carried out.

Referring to FIGS. 1A to 1D, process steps for fabricating a gate electrode are explained. In this gate electrode, the high-k material is used to form a gate dielectric film.

Referring to FIG. 1A, the surface oxidation film has is removed from the surface of a silicon substrate 301.

Figure 1B:
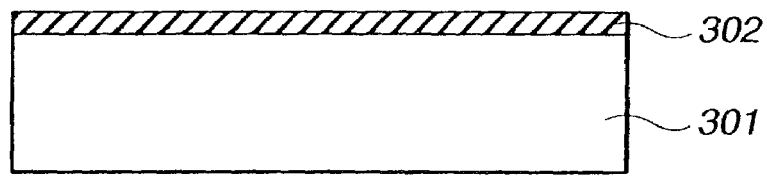

Referring to FIG. 1B, a gate dielectric film 302 of hafnium oxide is formed on the surface of the silicon substrate 301. For example, CVD technique is used to form the gate dielectric film 302. In the embodiment, the thickness of the gate dielectric film is in the vicinity of 5 nanometers (nm).

Figure 1C:
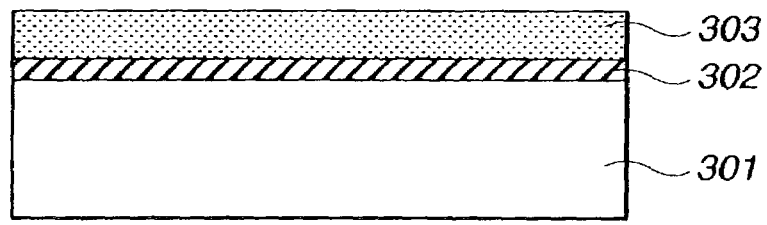

Referring to FIG. 1C, a gate electrode film 303 is formed on the gate dielectric film 302. The gate electrode film 303 may be made of poly-silicon or tungsten that has high melting point. In the embodiment, the gate electrode film 303 is made of poly-silicon. The gate electrode film 303 is formed immediately after the formation of the gate dielectric film 302 within the same film forming apparatus continuously. This continuous processing without removing the substrate out of the film forming apparatus is effective in preventing occurrence of interface between the gate dielectric film 302 and the gate electrode film 303. The interface, if occurred between them, might have bad influence on the performance of the transistor.

In the embodiment, the process temperature of forming the gate electrode film 303 is equal to or higher than 400° C. Such high temperature processing accelerates crystallization of the gate dielectric film 302, causing a rise in specific inductive capacity (SIC).

Figure 1D:
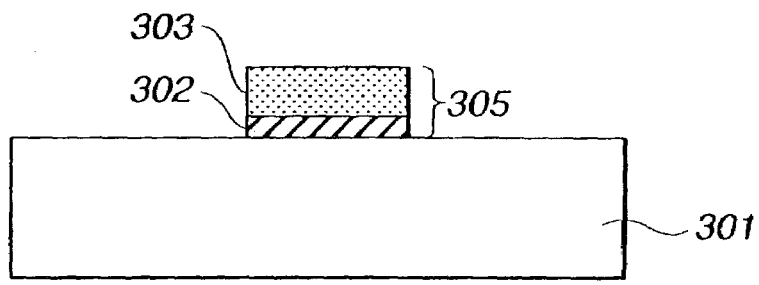

Subsequently, the gate electrode film 303 and gate dielectric film 302 are patterned using dry etch technique, for example. FIG. 1D illustrates a gate electrode 305 after the patterning.

A need remains for removing the hafnium oxide adhered to the substrate rear and end faces during the process step of forming the gate dielectric film 302 (see FIG. 1B). As explained above, the gate dielectric film 302 and the hafnium oxide adhered to the substrate rear and end faces are subject to high temperature processing step of forming the gate electrode film 303 within the same film forming apparatus. This is found to be effective in preventing the occurrence of interface between the gate dielectric film 302 and gate electrode film 303. However, high temperature processing causes a change in crystallization of the hafnium oxide, making is extremely difficult to remove from the substrate rear and end faces. According to the embodiment of the present invention, the hafnium oxide, which has been subjected to processing at high temperature, is removed without any difficulty.

In the embodiment of the present invention, after the process step of forming the gate electrode film 303 shown in FIG. 1C, the removing or washing process steps A to D are carried out. In the embodiment, the before-mentioned spin washing process as illustrated in FIGS. 5 and 6A-6B is employed.

In this embodiment, the four removing or washing process steps A to D are employed.

In step A, an aqueous solution of hydrofluoric acid equal to or greater than 40 mass % is used as a first remover or washing liquid. The washing time is 10 to 180 seconds.

In step B, an aqueous solution containing nitric acid 10-80 mass % and hydrofluoric acid 1-20 mass % is used as a second remover or washing liquid. The washing time is 1 to 10 seconds.

In step C, an aqueous solution of hydrofluoric acid equal to or greater than 40 mass % is used as a third remover or washing liquid. The washing time is 10 to 60 seconds.

In step D, an aqueous solution containing nitric acid 10-80 mass % and hydrofluoric acid 1-20 mass % is used as a second remover or washing liquid. The washing time is 1 to 10 seconds.

In this embodiment, as different from the previous embodiment, the first and third remover or washing liquids may contain oxidizing agent (excluding "nitric acid") such as, hypochlorous acid and periodic acid.

When the $HfO_f$ film is formed on the silicon substrate, there appear hafnium silicate $(HfSi)_x(SiO_2)_{1-x}$ and hafnium silicide $HfSi_x$ in the interface. These materials are difficult to remove in the prior art.

In the embodiment, these materials are removed by carrying out the washing process steps A to D mentioned above.

Carrying out the process step A removes $HfO_2$ from the rear and end faces of the substrate. Subsequently, carrying out the process step B removes the hafnium silicate and oxidizes hafnium silicide. Due to the combination effect of nitric acid and hydrofluoric acid, oxidation proceeds deeply into the hafnium silicide. In this manner, the hafnium silicide changes in quality into the $HfO_x$ like film.

Carrying out the process step C removes the $HfO_x$ like film. As it is, hafnium silicide is difficult to remove. However, the hafnium silicide as deformed into the $HfO_x$ like film is easy to remove by application of the aqueous solution of hydrofluoric acid equal to or greater than 40 mass %.

In the interface between the $HfO_x$ and the silicon substrate, a reaction by-product of hafnium silicate appears. To remove this by-product, the process step D is carried out.

In the previous description, the present invention is described as the removing or washing process steps for removing or washing away contamination adhered to the substrate rear and end faces. The contamination removing process steps may be carried out in different area.

(i) The contamination removing process steps may be carried out after the fabrication step of FIG. 1C before the patterning is carried out. In this case, the contamination is completely removed before dry etch. Thus, the contamination within an apparatus for carrying out dry etch is prevented from contamination.

(ii) The contamination removing process step may be carried out after the fabrication step of FIG. 1D. In this case, the contamination resulting from the patterning and the contamination resulting from the formation of gate dielectric film can be removed altogether.

In the previously described embodiments, the contamination removing process steps is applied to remove the contamination from the substrate rear and end faces. The present invention is also applicable to etching of the gate dielectric film. For example, with portions to be left covered with mask, the removing process steps are carried out to etch the portion of the gate dielectric film to be removed.

To confirm the effect of the present invention, the following experiment was conducted.

With AL-CVD, zirconium oxide is deposited on the front surface of a silicon substrate to 10 nm thick. A HF (hydrofluoric acid) containing recovery liquid is used to collect contamination adhered to the rear surface of the silicon substrate. The collected contamination was analyzed by ICP-MS. The silicon substrate used was an 8-inch wafer.

The measurements of contamination were made after carrying out the process steps A to D, respectively. The process steps A to D are as follows:

In step A, an aqueous solution of hydrofluoric acid 50 mass % was used during washing period of time 90 seconds.

In step B, an aqueous solution of nitric acid 50 mass % and hydrofluoric acid 5 mass % was used during washing period of 8 seconds.

In step C, an aqueous solution of hydrofluoric acid 50 mass % was used during washing period of time 10 seconds.

In step D, an aqueous solution of nitric acid 50 mass % and hydrofluoric acid 5 mass % was used during washing period of 8 seconds.

Figure 9:
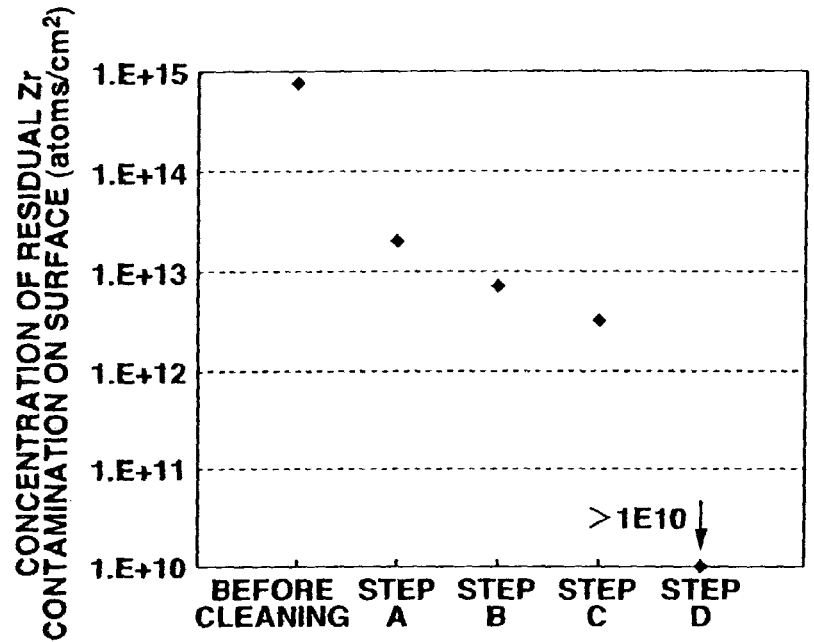
FIG. 9 is a graph of measurements of concentration of residual Zr versus the progress of contamination removing steps according to an embodiment according to the present invention.
Figure 11A:
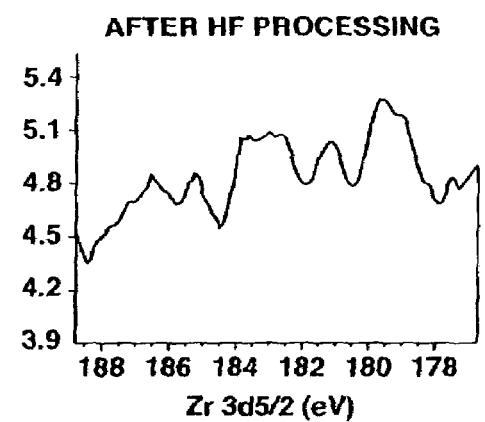
FIG. 11A is graph of attenuated total reflection (ATR) X-ray photoelectron spectroscopy (XPS) spectra obtained by surface analysis of a substrate after being wet processed by an aqueous solution of hydrofluoric acid by 50 mass %.
Figure 11B:
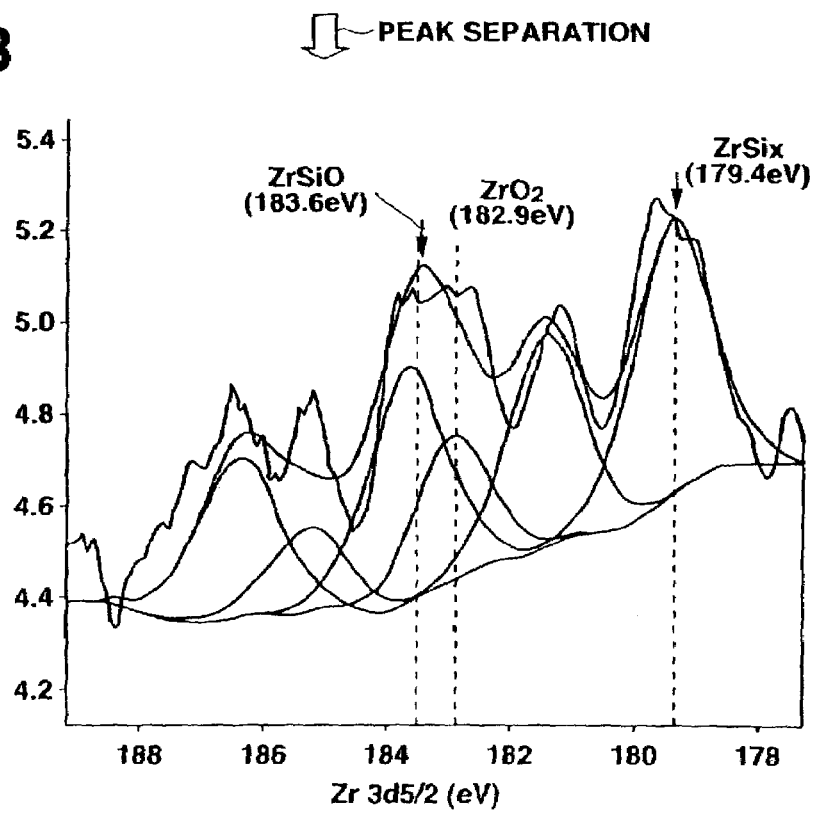
FIG. 11B is a graph the result from peak separation of the spectra in FIG. 11A.

FIG. 9 shows the results of measurements of surface contamination after each of the steps A to D. From these results, it will be appreciated that there is a remarkable reduction in surface contamination after conducting the steps B, C and D although a reduction in surface contamination after conducting the step A is not as much as expected. It is assumed that there remain components other than zirconium oxide on the surface after the step A. To confirm this assumption, we conducted surface inspection of the substrate surface after the step A with attenuated total reduction X-ray photoelectron spectroscopy. FIG. 11A is the measured data, and FIG. 11B shows the result after peak separation of the measured data. From FIG. 11B, we obtained that ZrSiO, $ZrO_2$ and $ZrSi_x$ remain on the substrate surface.

Figure 12A:
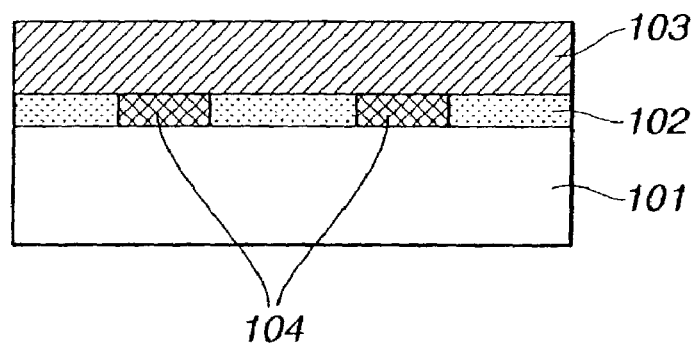
FIGS. 12A and 12B are views, illustrating a semiconductor substrate before and after application of an aqueous solution of hydrofluoric acid by 50 mass %.
Figure 12B:
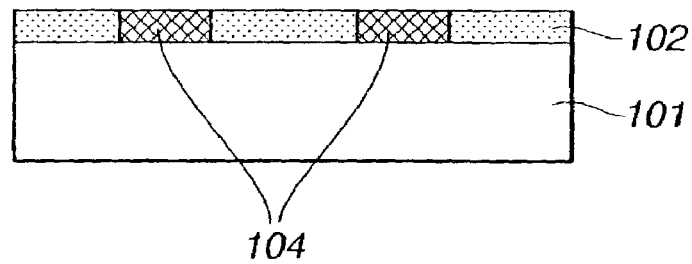

Referring to FIGS. 12A and 12B, FIG. 12A illustrates a silicone substrate before the step A, and FIG. 12B illustrates the substrate after the step A. Forming $ZrO_2$ film 103 on the surface of silicon substrate 101 causes creation of reaction by-product of zirconium silicate 102 and by-product of zirconium silicide 104. Washing with hydrofluoric acid dissolves $ZrO_2$ film 103, leaving zirconium silicate 102 and zirconium silicide 104 on the surface of silicon substrate 101. Thus, Zr containing contamination remains. According to the embodiments of the present invention, the undesired Zr containing by-products are removed through the subsequent steps B to D.

The graph in FIG. 9 clearly supports the advantageous effect according to the embodiments of the present invention.

To confirm the temperature dependency, we conducted the following experiment.

Figure 10:
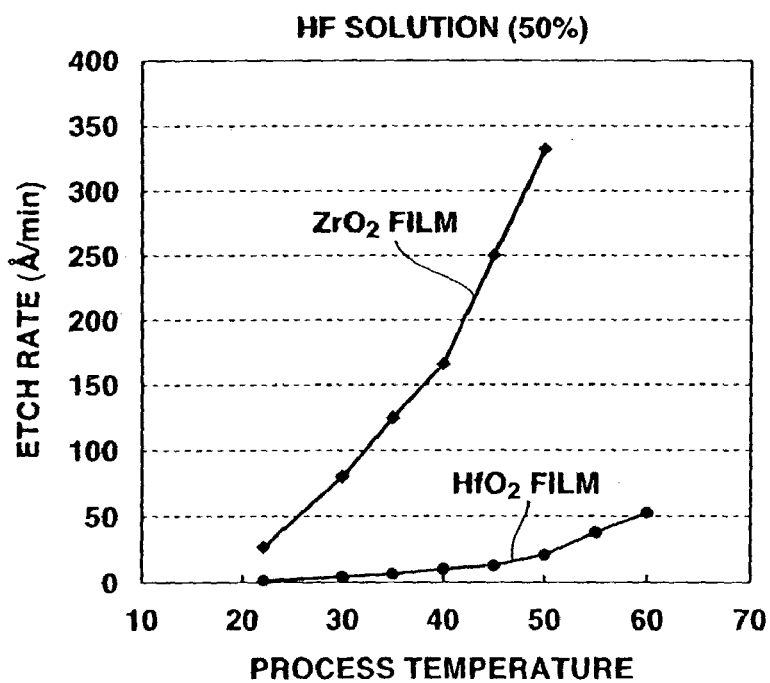
FIG. 10 is a graph of measurements of etch rate of two different high-k films verse process temperature when hydrofluoric acid was used.

Out of silicon substrate formed with zirconium oxide film 5 nm thick and silicon substrate formed with hafnium oxide film 5 nm thick, a number of samples, each measuring 2 cm by 2 cm, were cut. The samples were immersed into an aqueous solution of hydrofluoric acid 50 mass % with different temperatures. The results are shown in the graph in FIG. 10. From this result, it will be appreciated that the temperature dependency of $ZrO_2$ is remarkable as compared to that of $HfO_2$. Hence, it is preferable to elevate the temperature of removal or washing liquids when the contaminant to be removed contains Zr group.

While the present invention has been particularly described, in conjunction with exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Application No. 2002-027361, filed Feb. 4, 2002, the disclosure of which is hereby incorporated by reference in its entirety.

What is claimed is:

1. A method for removing contamination adhering to a silicon substrate rear and end faces, the contamination containing at least one element selected from zirconium (Zr) and hafnium (Hf) and wherein the contamination includes the at least one element bonded with silicon (Si), the method comprising:

a first process of wet processing the silicon substrate by a first remover liquid that contains hydrofluoric acid, the hydrofluoric acid being a concentration equal to or greater than 30 mass %; and a second process of wet processing the silicon substrate by a second remover liquid that contains oxidizing reagent and one of hydrofluoric acid and salt of hydrofluoric acid;

a third process of wet processing the silicon substrate, after the second process, by a third remover liquid that contains one of hydrofluoric acid and salt of hydrofluoric acid; and a fourth process of wet processing the silicon substrate by a fourth remover liquid that contains oxidizing reagent and one of hydrofluoric acid and salt of hydrofluoric acid.

2. The method as claimed in claim 1, wherein the oxidizing reagent of the second remover liquid is at least one compound selected from a group consisting of nitric acid, chloric acid, perchioric acid, iodic acid, periodic acid, bromic acid, perbromic acid, salt containing bromine oxide ion, salt containing manganese oxide ion, and salt containing tetra cerium ion.

3. The method as claimed in claim 1, wherein the oxidizing reagent of the fourth remover liquid is at least one compound selected from a group consisting of nitric acid, chloric acid, perchloric acid, iodic acid, periodic acid, bromic acid, perbromic acid, salt containing bromine oxide ion, salt containing manganese oxide ion, and salt containing tetra cerium ion.

4. The method as claimed in claim 1, wherein the oxidizing reagent of the fourth remover liquid is nitric acid.

5. The method as claimed in claim 1, wherein the contamination includes at least one oxide selected from zirconium oxide and hafnium oxide.

6. A method for fabricating a semiconductor device, comprising:
- a first process of wet processing a silicon substrate rear and end faces by a first remover liquid that contains hydrofluoric acid, the hydrofluoric acid being a concentration equal to or greater than 30 mass %, after forming a film on the silicon substrate, the film containing at least one element selected from zirconium (Zr) and hafnium (Hf) and wherein the film includes the at least one element bonded with silicon (Si); and
- a second process of wet processing the silicon substrate which has been wet processed in the first process, by a second remover liquid that contains oxidizing reagent and one of hydrofluoric acid and salt of hydrofluoric acid;
- a third process of wet processing the silicon substrate, after the second process, by a third remover liquid that contains one of hydrofluoric acid and salt of hydrofluoric acid; and
- a fourth process of wet processing the silicon substrate, after the third process, by a fourth remover liquid that contains oxidizing reagent and one of hydrofluoric acid and salt of hydrofluoric acid.

7. The method as claimed in claim 6, wherein the oxidizing reagent of the second remover liquid is at least one compound selected from a group consisting of nitric acid, chloric acid, perchloric acid, iodic acid, periodic acid, bromic acid, perbromic acid, salt containing bromine oxide ion, salt containing manganese oxide ion, and salt containing tetra cerium ion.

8. The method as claimed in claim 6, wherein the oxidizing reagent of the fourth remover liquid is at least one compound selected from a group consisting of nitric acid, chloric acid, perchloric acid, iodic acid, periodic acid, bromic acid, perbromic acid, salt containing bromine oxide ion, salt containing manganese oxide ion, and salt containing tetra cerium ion.

9. The method as claimed in claim 6, wherein the oxidizing reagent of the fourth remover liquid is nitric acid.

10. The method as claimed in claim 6, wherein the film includes at least one oxide selected from zirconium oxide and hafnium oxide.

11. The method as claimed in claim 6, wherein a film of hafnium oxide formed on the semiconductor substrate and thermally processed at temperatures equal to or greater than 400° C. is removed in the first process of wet processing the semiconductor substrate by the first remover liquid.

12. A method for fabricating a semiconductor device, comprising:
- a first process of wet processing a silicon substrate by a first remover liquid that contains hydrofluoric acid, the hydrofluoric acid being a concentration equal to or greater than 30 mass %, after forming a film on the silicon substrate, the film containing at least one element selected from zirconium (Zr) and hafnium (Hf);
- a second process of wet processing the silicon substrate, which has been wet processed in the first process, by a second remover liquid that contains oxidizing reagent and one of hydrofluoric acid and salt of hydrofluoric acid;
- a third process of wet processing the silicon substrate, after the second process, by a third remover liquid that contains hydrofluoric acid; and
- a fourth process of wet processing the silicon substrate, after the third process, by a fourth remover liquid that contains oxidizing reagent and one of hydrofluoric acid and salt of hydrofluoric acid.

13. The method as claimed in claim 12, wherein the oxidizing reagent of the second remover liquid is nitric acid.

14. The method as claimed in claim 12, wherein the oxidizing reagent of the fourth remover liquid is nitric acid.

15. The method as claimed in claim 12, wherein the film includes at least one oxide selected from zirconium oxide and hafnium oxide.

16. The method as claimed in claim 12, wherein a film of hafnium oxide formed on the silicon substrate and thermally processed at a temperature equal to or greater than 400° C. is removed in the first process of wet processing the silicon substrate by the first remover liquid.

* * * * *